US009828667B2

(12) United States Patent
Zhuang et al.

(10) Patent No.: US 9,828,667 B2
(45) Date of Patent: Nov. 28, 2017

(54) METHOD FOR MAKING TIN OXIDE THIN FILM

(71) Applicants: Tsinghua University, Beijing (CN); HON HAI PRECISION INDUSTRY CO., LTD., New Taipei (TW)

(72) Inventors: Da-Ming Zhuang, Beijing (CN); Ming Zhao, Beijing (CN); Li Guo, Beijing (CN); Ming-Jie Cao, Beijing (CN); Liang-Qi Ouyang, Beijing (CN); Leng Zhang, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 29 days.

(21) Appl. No.: 14/842,198

(22) Filed: Sep. 1, 2015

(65) Prior Publication Data

US 2016/0329196 A1    Nov. 10, 2016

(30) Foreign Application Priority Data

May 8, 2015 (CN) .......................... 2015 1 0231321

(51) Int. Cl.
*C23C 14/08* (2006.01)
*C23C 14/00* (2006.01)
(Continued)

(52) U.S. Cl.
CPC .......... *C23C 14/086* (2013.01); *C04B 35/457* (2013.01); *C04B 35/6261* (2013.01); *C04B 35/6455* (2013.01); *C23C 14/0036* (2013.01); *C23C 14/3414* (2013.01); *C23C 14/35* (2013.01); *C23C 14/5806* (2013.01); *H01J 37/3429* (2013.01); *C04B 2235/40* (2013.01);
(Continued)

(58) Field of Classification Search
CPC ... C23C 14/35; C23C 14/0036; C23C 14/086; C23C 14/3414; C23C 14/08; C23C 14/5806; H01J 37/3429; C04B 35/457; C04B 35/6261; C04B 35/6455
See application file for complete search history.

(56) References Cited

U.S. PATENT DOCUMENTS

| | | | |
|---|---|---|---|
| 6,218,208 B1* | 4/2001 | Chou | G01N 27/414 438/197 |
| 2003/0178751 A1* | 9/2003 | Song | B82Y 30/00 264/603 |

FOREIGN PATENT DOCUMENTS

| CN | 101638772 A | * | 2/2010 |
|---|---|---|---|
| JP | 49109896 A | * | 10/1974 |

(Continued)

OTHER PUBLICATIONS

Machine Translation TW201309825A.*
(Continued)

*Primary Examiner* — Michael Band
(74) *Attorney, Agent, or Firm* — Steven Reiss

(57) ABSTRACT

A method for making a SnO thin film includes steps of: providing a substrate and a tin oxide sputtering target; spacing the substrate and the tin oxide sputtering target from each other; and sputtering the SnO thin film on the substrate by using a magnetron sputtering method. The tin oxide sputtering target comprises uniformly mixed elemental Sn and $SnO_2$. An atomic ratio of Sn atoms and O atoms in the tin oxide sputtering target satisfies $1:2<Sn:O\leq2:1$.

10 Claims, 5 Drawing Sheets

(51) Int. Cl.

| | |
|---|---|
| *C23C 14/35* | (2006.01) |
| *C23C 14/34* | (2006.01) |
| *H01J 37/34* | (2006.01) |
| *C04B 35/457* | (2006.01) |
| *C04B 35/626* | (2006.01) |
| *C04B 35/645* | (2006.01) |
| *C23C 14/58* | (2006.01) |

(52) U.S. Cl.
CPC .................. *C04B 2235/604* (2013.01); *C04B 2235/6562* (2013.01); *C04B 2235/661* (2013.01); *C04B 2235/77* (2013.01)

(56) References Cited

FOREIGN PATENT DOCUMENTS

| | | | |
|---|---|---|---|
| JP | 2013237908 A | * | 11/2013 |
| TW | 201221667 | | 6/2012 |
| TW | 201309825 A | * | 3/2013 |

OTHER PUBLICATIONS

Goodchild, R.; Webb, J.; Williams, D. Electrical properties of highly conducting and transparent thin films of magnetron sputtered $SnO_2$, Canada, 1984, p. 2308-2310 [online] [Accessed Jan. 18, 2017].*
Machine Translation JP2013237908A.*

* cited by examiner

… … …

METHOD FOR MAKING TIN OXIDE THIN FILM

CROSS-REFERENCE TO RELATED APPLICATIONS

This application claims all benefits accruing under 35 U.S.C. §119 from China Patent Application No. 201510231321.7, filed on May 8, 2015, in the China Intellectual Property Office. This application is related to commonly-assigned applications entitled, "TIN OXIDE SPUTTERING TARGET AND METHOD FOR MAKING THE SAME", filed ****.

FIELD

The present disclosure relates to tin oxide sputtering target< and method for making the same.

BACKGROUND

At present, n-type thin film transistor (TFT) has been well developed. However, in OLED, a threshold voltage fluctuation of the n-type TFT decreases a stability of light brightness. P-type TFT can be used to effectively avoid this problem and improve the luminous efficacy of the OLED.

Stannous oxide (i.e., tin(II) oxide, SnO) is an important p-type semiconductor whose electronic structure is different from that of most of other oxide semiconductors The valence band of SnO is formed from a hybridization of O's 2p orbit and Sn's 5s orbit. As a result, a hole mobility of SnO is higher than most of the other oxides, which can improve the mobility of the p-type TFT.

The sputtering target made of Sn metal or SnO can be used to sputter the SnO thin film. However, when the sputtering target is Sn metal, sputtering power and substrate temperature are limited due to the low melting point of the Sn metal. A high sputtering power may melt the Sn metal into liquid form. However, a low sputtering power reduces the sputtering efficiency. In addition, sputtering the Sn metal target easily results a $SnO_2$ film, not the SnO film, so the sputtering conditions are strictly confined. On the other hand, SnO has a relative high resistance. Therefore, when using the SnO as the sputtering target, the SnO thin film can be sputtered only by a radio frequency magnetron sputtering (RF magnetron sputtering) method, which has a low sputtering rate. In addition, the SnO target can be made by sintering SnO powders. The SnO target sintered from the SnO powders at a low temperature has a low relative density. The SnO target sintered from the SnO powders at a high temperature has a poor thermal stability. Thus, the sintering reaction is complicated, and so that components of the SnO target and the SnO thin film are difficult to precisely control.

BRIEF DESCRIPTION OF THE DRAWINGS

Implementations of the present technology will now be described, by way of example only, with reference to the attached figures.

DETAILED DESCRIPTION

Figure 1:
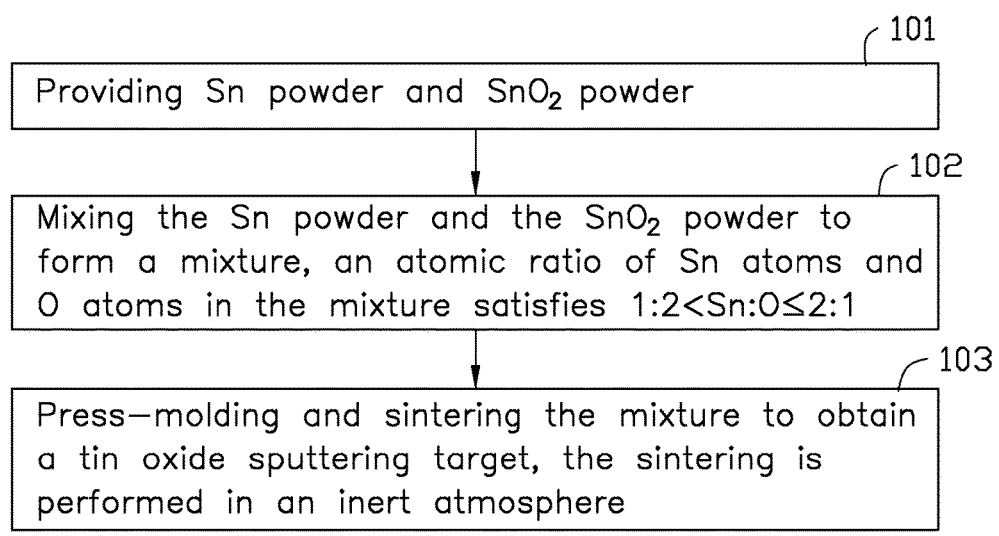
FIG. 1 is a flowchart of an embodiment of a method for making a tin oxide sputtering target.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "comprise" or "comprising" when utilized, means "include or including, but not necessarily limited to"; it specifically indicates open-ended inclusion or membership in the so-described combination, group, series, and the like.

One embodiment of a tin oxide sputtering target is provided. The tin oxide sputtering target is used to make a tin oxide (SnO) thin film. The tin oxide sputtering target comprises uniformly mixed elemental Sn and $SnO_2$. An atomic ratio of Sn atoms and O atoms, which is represented by Sn:O in the present specification, in the tin oxide sputtering target is in a range of $1:2<Sn:O\leq2:1$.

The Sn:O in the tin oxide sputtering target can be controlled by the Sn:O in the SnO thin film. The Sn:O in the tin oxide sputtering target is substantially the same with the Sn:O in the SnO thin film. The controlling of the range $1:2<Sn:O\leq2:1$ in the tin oxide sputtering target is to control the Sn:O in the SnO film in the same range, making the SnO thin film to be p-type conductive and have a high mobility. In one embodiment, the Sn:O in the tin oxide sputtering target is in a range of $1.5:2<Sn:O\leq2.5:2$.

The tin oxide sputtering target can also comprise other doping elements besides Sn and O. In one embodiment, an amount of the doping element in the tin oxide sputtering target is less than 10 ppm.

A relative density of the tin oxide sputtering target can be greater than 80%. The relative density is a ratio of a real density to a theoretical density of the sputtering target. A resistance of the tin oxide sputtering target can be in a range from about $10^{-5}\Omega\cdot cm^{-1}$ to about $10^{5}\Omega\cdot cm^{-1}$.

A shape of the tin oxide sputtering target can be selected according to actual needs. The shape of the tin oxide sputtering target, such as a cuboid, cube, cylinder, or irregular shape.

In the process of making the SnO thin film, the melting point of the tin oxide sputtering target is higher than the Sn target, so the tin oxide sputtering target can be sputtered at a high power to increase the sputtering rate. Comparing to the SnO target, due to the presence of the metal phase (i.e., the elemental Sn) in the tin oxide sputtering target, the sputtering method is not limited to the RF magnetron sputtering, so that the sputtering rate can be increased. In addition, because the components of the tin oxide sputtering target can be precisely controlled, the components of the SnO thin film can also be precisely controlled.

FIG. 1 presents a flowchart in accordance with an illustrated example embodiment. The embodiment of a method 100 for making the tin oxide sputtering target is provided by way of example, as there are a variety of ways to carry out the method 100. Each block shown in FIG. 1 represents one or more processes, methods, or subroutines carried out in the exemplary method 100. Additionally, the illustrated order of blocks is by example only and the order of the blocks can be changed. The exemplary method 100 can begin at block 101. Depending on the embodiment, additional steps can be added, others removed, and the ordering of the steps can be changed.

At block 101, the Sn powder and the $SnO_2$ powder are provided.

At block 102, the Sn powder and the $SnO_2$ powder are mixed to form a mixture.

In the mixture, the Sn:O satisfies 1:2<Sn:O≤2:1.

At block 103, the mixture is press-molded and sintered to obtain a tin oxide sputtering target, and the sintering is performed in an inert atmosphere.

At block 101, in one embodiment, a purity of the Sn powder and the $SnO_2$ powder can be 3 N (99.9 mass %) to 5 N (99.999%). A mass ratio of the Sn powder and $SnO_2$ powder can be controlled according to the Sn:O in the mixture. In one embodiment, the mass ratio of the Sn powder and $SnO_2$ powder is in a range from 0.4 to 1.2, then the Sn:O in the tin oxide sputtering target satisfies 1.5:2<Sn:O≤2.5:2.

At block 102, the Sn powder and the $SnO_2$ powder can be mixed by different ways that are not limited, such as grinding or ball-milling. The mixing can be performed in air or in an inert atmosphere (e.g., in 5 N argon (Ar) or 5 N nitrogen ($N_2$) gas). In one embodiment, in the mixture, the particle diameters of the Sn powder and the $SnO_2$ powder are less than or equal to 10 micrometers. In another embodiment, in the mixture, the particle diameters of the Sn powder and the $SnO_2$ powder are in a range about from 0.5 micrometer to 2 micrometers.

In one embodiment, the Sn powder and the $SnO_2$ powder are mixed by using a ball-milling method. The mixing of the Sn powder and $SnO_2$ powder can further comprise steps of: ball milling the Sn powder and $SnO_2$ powder together in a liquid medium to form a wet mixture; and drying the wet mixture to remove the liquid medium to obtain the mixture that is dry. The ball milling can take place in a ball milling machine. The liquid medium, the Sn powder, and the $SnO_2$ powder are introduced into the ball milling machine. During the ball milling, the Sn powder and the $SnO_2$ powder mix with each other uniformly, and the particle diameters of the powders decrease. The ball milling can last until the Sn powder and the $SnO_2$ powder are uniformly mixed and the particle diameters of the powders have decreased to the desired sizes. In some embodiments, a rotating speed of the ball milling machine is in a range from about 100 rpm to 600 rpm. The liquid medium is not reactive with the Sn powder and the $SnO_2$ powder and can be removed from the wet mixture by a drying step, and brings no impurity into the mixture. The liquid medium can be water, ethanol, acetone, or combinations thereof. The liquid medium works as a dispersing agent and can make the Sn powder and the $SnO_2$ powder mix more uniformly. To prevent the Sn powder and the $SnO_2$ powder to be melted at the drying step, the wet mixture is dried in an environment that is at about 30° C. to about 150° C. to remove the liquid medium in air or in the inert atmosphere. In one embodiment, the wet mixture is dried at about 30° C. to about 60° C. to remove the liquid medium.

At block 103, the mixture can be molded or pressed into a desired shape before or during the sintering step. The relative density of the tin oxide sputtering target can be increased by the sintering. In the sintering step, the $SnO_2$ powder has a high thermal stability and does not decompose, which can precisely control the components in the tin oxide sputtering target. The Sn powder is a pure tin metal having a low melting point, which has a liquid-phase-assisted sintering action, so that the relative density of the tin oxide sputtering target can be increased.

The mixture can be molded or pressed into a desired shape before or during the sintering step. In some embodiment, a hot pressing method or a hot isostatic pressing (HIP) method can be used to simultaneously mold/press and sinter the mixture. The hot pressing applies a pressure of about 30 MPa to 100 MPa at the temperature of about 200° C. to about 800° C. for about 0.5 hour to about 24 hours. The hot isostatic pressing applies a pressure of about 100 MPa to 300 MPa at the temperature of about 200° C. to about 800° C. for about 1 hour to about 40 hours.

In another embodiment, the mixture can be previously pressed/molded into the desired shape, and then sintered under normal pressure. The previously molding/pressing step can be processed by applying a pressure of about 50 MPa to about 300 MPa. The mixture with the desired shape can be sintered under normal pressure at the temperature of about 200° C. to about 800° C. for about 1 hour to about 40 hours.

The inert atmosphere can be a rare gas, such as argon gas, nitrogen gas or combination thereof.

The method for making the tin oxide sputtering target can precisely control the Sn:O in the tin oxide sputtering target, and can increase the relative density of the tin oxide sputtering target. Since the components of the tin oxide sputtering target can be controlled, the components of the SnO thin film can be precisely controlled.

Figure 2:
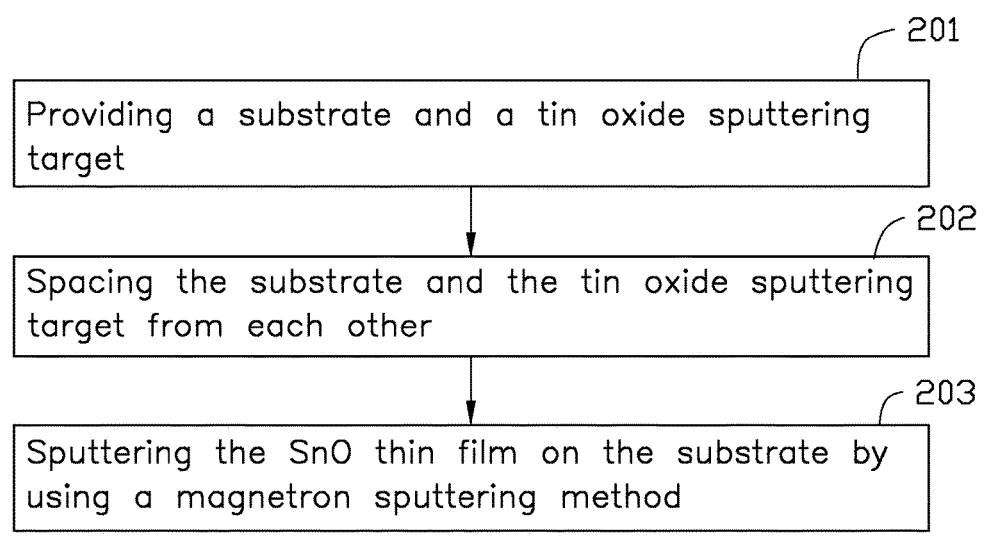
FIG. 2 is a flowchart of an embodiment of a method for making a SnO thin film.

FIG. 2 presents a flowchart in accordance with an illustrated example embodiment. The embodiment of a method 200 for making the SnO thin film is provided by way of example, as there are a variety of ways to carry out the method 100. Each block shown in FIG. 2 represents one or more processes, methods, or subroutines carried out in the exemplary method 200. Additionally, the illustrated order of blocks is by example only and the order of the blocks can be changed. The exemplary method 200 can begin at block 201. Depending on the embodiment, additional steps can be added, others removed, and the ordering of the steps can be changed.

At block 201, a substrate and the tin oxide sputtering target are provided.

At block 202, the substrate and the tin oxide sputtering target are spaced from each other.

At block 203, the SnO thin film is sputtered on the substrate by using a magnetron sputtering method.

At block 201, a material of the substrate is thermal stable. Therefore the substrate is capable of enduring a preheating process. The substrate may be a rigid substrate, such as a glass substrate or a silicon substrate. When the substrate is preheated at a relatively low temperature, the substrate can be a flexible substrate, such as polyimide (PI) substrate or polyethylene (PE) substrate. Before the step at block 202, the substrate can be cleaned and dried, in order to not bring impurities into the SnO thin film.

At block 202, an angle can be formed between the outer surface of the tin oxide sputtering target and the surface of the substrate. The angle can be in a range from about 20° to about 85°. In one embodiment, the outer surface of the tin oxide sputtering target can be parallel to the surface of the substrate. A distance between the tin oxide sputtering target and the substrate can be smaller than or equal to 8 cm.

After the step at block 202, the substrate can be preheated, which is good to perform the sputtering step at block 203. The substrate can be preheated at the temperature of about 50° C. to about 400° C.

At block 203, the magnetron sputtering is performed in the atmosphere containing the argon gas. In one embodiment, the magnetron sputtering is performed in the pure argon gas atmosphere. The Sn atoms and the O atoms of the SnO thin film can be entirely obtained from the tin oxide sputtering target, ensuring the Sn:O of the SnO thin film is substantially the same with the Sn:O of the tin oxide sputtering target, so that the components of the SnO thin film can be precisely controlled by controlling the Sn:O of the tin oxide sputtering target.

It is noted that uncontrollable factors (e.g., the defects of Sn powder and $SnO_2$ powder that are used to form the sputtering target) may affect the Sn:O of the tin oxide sputtering target. Therefore, in order to control the Sn:O of the SnO thin film to reach a desired value, additional $O_2$ gas or $H_2$ gas can be introduced with the argon gas during the magnetron sputtering. When the tin oxide sputtering target lacks O atoms, an amount of $O_2$ can be added to the pure Ar gas atmosphere. When the tin oxide sputtering target contains superfluous O atoms, an amount of $H_2$ can be added to the pure Ar gas atmosphere.

The sputtering method can be a medium frequency magnetron sputter method, an RF (radio frequency) sputter method, or a DC (direct current) sputter method. In one embodiment, the sputtering method is the medium frequency magnetron sputter method. The sputtering rate of the medium frequency magnetron sputter method is higher than the RF (radio frequency) sputter method and the DC (direct current) sputter method. The current of the medium frequency magnetron sputter method can be about 0.1 A to about 2.0 A. The higher the current, the sputtering rate is faster. In one embodiment, the current of the medium frequency magnetron sputter method is about 1.0 A to about 2.0 A. The sputtering of the medium frequency magnetron sputter method can take place for about 1 minute to about 120 minutes at a pressure about 0.1 Pa to about 2.0 Pa.

The SnO thin film is an amorphous film. After obtaining the SnO thin film, the method can also comprise an annealing step after the step shown in block 203. The SnO thin film is annealed in vacuum or the inert atmosphere to obtain a polycrystalline SnO thin film.

The background vacuum used in the annealing can be about $10^{-3}$ Pa to about 10 Pa. The annealing temperature can be in a range from about 150° C. to about 300° C. A speed in a range from about 1° C./min to about 20° C./min can be used to increase the temperature of the SnO thin film to the annealing temperature. The SnO thin film can be annealed for about 1 hour to about 10 hours.

The polycrystalline SnO thin film is a p-type semiconductor. The Sn:O in the polycrystalline SnO thin film satisfies 1:2<Sn:O≤2:1. A majority of the Sn atoms of the polycrystalline SnO thin film have a valence of +2. A small number of the Sn atoms of the polycrystalline SnO thin film have a valence of 0 or +4. The carrier density of the polycrystalline SnO thin film is about $10^{17} cm^{-3}$ to about $10^{18}$ $cm^{-3}$. The carrier mobility of the polycrystalline SnO thin film is about 0.5 $cm^2 V^{-1} S^{-1}$ to about 2.1 $cm^2 V^{-1} S^{-1}$. The band gap of the polycrystalline SnO thin film is about 2.5 eV to 3.0 eV. The thickness of the polycrystalline SnO thin film is in a range from about 10 nm to about 1000 nm. The transmittance of the polycrystalline SnO thin film is about 50% to about 80%.

The method of making the SnO thin film can sputter under a large power, and the sputtering is stability, and the sputtering rate is increased. At the same time, the components of SnO thin film can be precisely controlled.

EXAMPLE 1

Tin Oxide Sputtering Target

EXAMPLE 1-1

Figure 3:
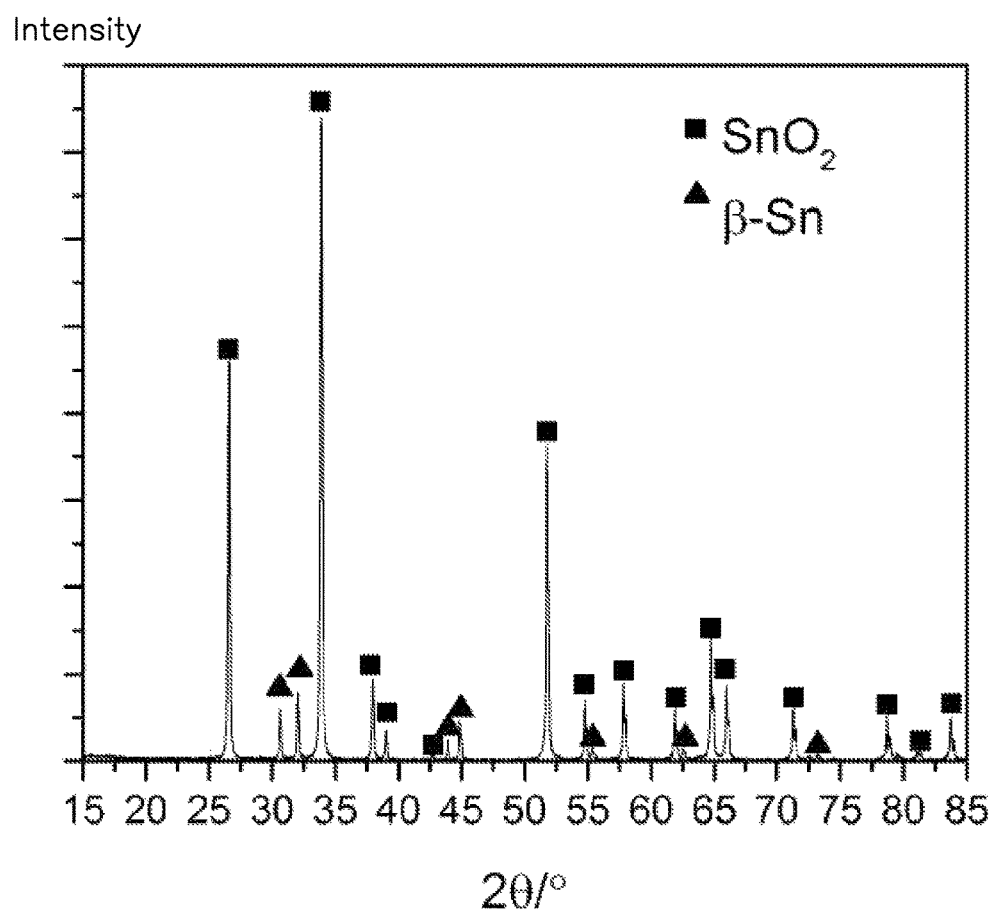
FIG. 3 shows an X-ray diffraction (XRD) pattern of the tin oxide sputtering target in Example 1-1.

240 g of Sn powder and 250 g of $SnO_2$ powder having purities of 5 N are mixed in a ball milling machine having absolute ethyl alcohol as the liquid medium, at a rotating speed of about 200 rpm for about 10 hours. After that, the wet mixture is dried at a pressure of about 1 atm in an Ar gas atmosphere (5 N) for about 1 hour to remove the absolute ethyl alcohol. The mixture is sintered in Ar gas atmosphere at a pressure of about 50 MPa and a temperature of about 300° C. for about 4 hours with a speed of temperature increase of about 15° C./min in a hot press sintering furnace. The hot press sintering furnace is cooled to room temperature to obtain a tin oxide sputtering target. The obtained tin oxide sputtering target has a relative density greater than 85%. The XRD tests are conducted on the tin oxide sputtering target of Examples 1-1. FIG. 3 shows an X-ray diffraction (XRD) pattern of the tin oxide sputtering target in Example 1-1.

EXAMPLE 1-2

160 g of Sn powder and 160 g of $SnO_2$ powder having purities of 5 N are mixed in a ball milling machine having absolute ethyl alcohol as the liquid medium, at a rotating speed of about 400 rpm for about 20 hours. After that, the wet mixture is dried under atmosphere pressure for about 1 hour to remove the absolute ethyl alcohol. The mixture is molded and pressed at a pressure of about 75 MPa for about 30 minutes. The molded mixture is sintered at a normal pressure in $N_2$ gas atmosphere at a temperature of about 400° C. for about 8 hours with a speed of temperature increase of about 10° C./min in a sintering furnace. The sintering furnace is cooled to room temperature to obtain a tin oxide sputtering target. The obtained tin oxide sputtering target has a relative density greater than 80%.

EXAMPLE 1-3

300 g of Sn powder and 300 g of $SnO_2$ powder having purities of 5 N are mixed in a ball milling machine having absolute ethyl alcohol as the liquid medium, at a rotating speed of about 500 rpm for about 10 hours. After that, the wet mixture is dried at a pressure of about 1 atm in an $N_2$ gas atmosphere (5 N) for about 1 hour to remove the absolute ethyl alcohol. The mixture is hot isostatically pressed in Ar gas atmosphere at a pressure of about 100 MPa and a temperature of about 500° C. for about 20 hours with a speed of temperature increase of about 10° C./min a hot press sintering furnace. The hot press sintering furnace is cooled to room temperature to obtain a tin oxide sputtering target. The obtained tin oxide sputtering target has a relative density greater than 80%.

EXAMPLE 2

Thin Oxide Thin Film

EXAMPLE 2-1

Figure 4:
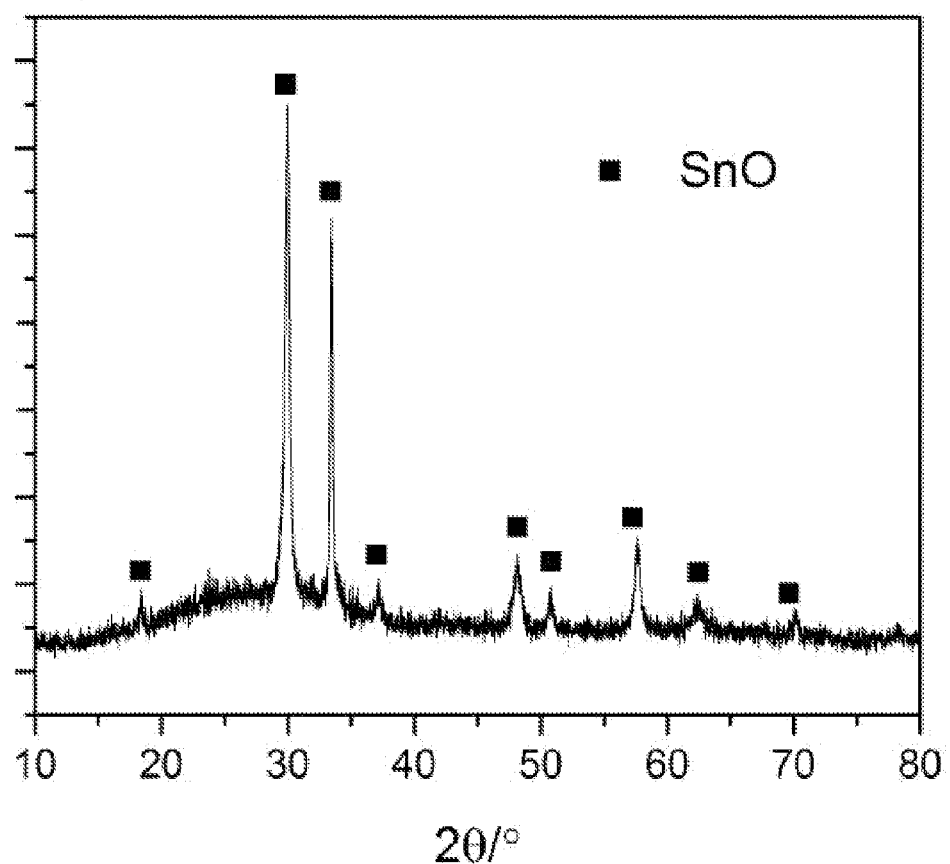
FIG. 4 shows an X-ray diffraction (XRD) pattern of a p-type SnO thin film in Example 2-1.
Figure 5:
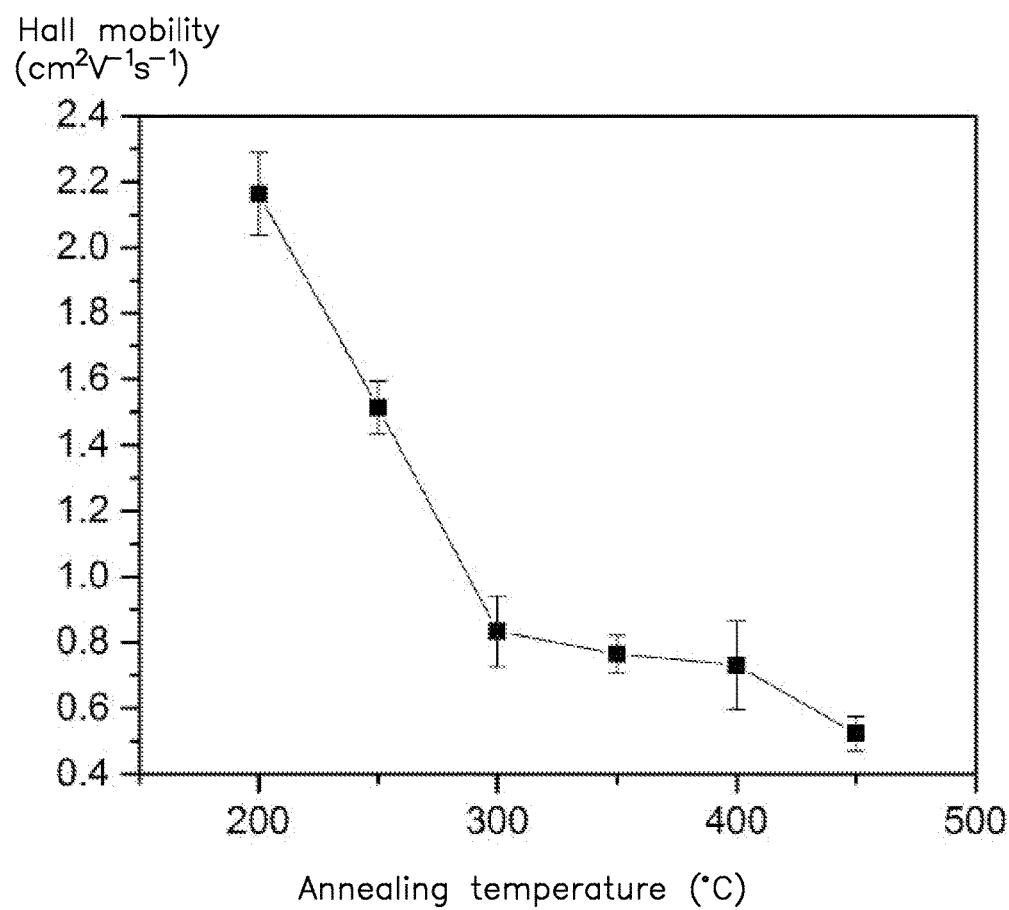
FIG. 5 is a diagram showing that effects of different annealing temperatures on the electrical properties of the p-type SnO thin film in Example 2-1.

A glass substrate is cleaned and dried by $N_2$ gas blowing. The glass substrate and the tin oxide sputtering target of Example 1-2 are disposed in a sputtering chamber. The surfaces of the tin oxide sputtering target and the substrate are parallel to each other about 8 cm distant. The carrier gas, which is Ar gas in this example, is introduced into the sputtering chamber. The pressure in the sputtering chamber is about 0.3 Pa. The sputtering is performed by using a current of about 1.0 A for about 20 minutes to form the SnO thin film with a thickness of about 500 nm. The SnO thin film is placed in a quartz tube furnace then annealed in an $N_2$ gas atmospheric pressure of 0.05 MPa for about 5 hours to obtain a p-type SnO thin film. The annealing temperature is about 200° C. A hall mobility of the p-type SnO thin film is about 0.6 $cm^2V^{-1}s^{-1}$, and the carrier density of the p-type SnO thin film is in a range from about $10^{17}$ $cm^{-3}$ to about $10^{18}$ $cm^{-3}$. The XRD tests are conducted on the p-type SnO thin film of Examples 2-1. FIG. 4 shows an X-ray diffraction (XRD) pattern of the p-type SnO thin film in Example 2-1. Referring to FIG. 5, the hall mobility and carrier density of the p-type SnO film of Examples 2-1 change with the annealing temperatures.

EXAMPLE 2-2

A PI substrate is cleaned and dried by $N_2$ gas blowing. The PI substrate and the tin oxide sputtering target of Example 1-1 are disposed in a sputtering chamber. The surfaces of the tin oxide sputtering target and the substrate are parallel to each other about 8 cm distant. The carrier gas, which is a combination of 95% Ar gas and 5% $O_2$ gas in this example, is introduced into the sputtering chamber. The pressure in the sputtering chamber is about 0.7 Pa. After preheating the substrate to 100° C., the sputtering is performed by using a current of about 1.0 A for about 5 minutes to form the SnO film with a thickness of about 50 nm. The SnO film is placed in a quartz tube furnace then annealed in an $N_2$ gas atmospheric pressure of 0.05 MPa for about 5 hours to obtain a p-type SnO film. The annealing temperature is about 180° C. A hall mobility of the p-type SnO film is about 0.4 $cm^2V^{-1}s^{-1}$, and the carrier density of the p-type SnO film is in a range from about $10^{17}$ $cm^{-3}$ to about $10^{18}$ $cm^{-3}$.

Depending on the embodiment, certain of the steps of methods described may be removed, others may be added, and the sequence of steps may be altered. It is also to be understood that the description and the claims drawn to a method may comprise some indication in reference to certain steps. However, the indication used is only to be viewed for identification purposes and not as a suggestion as to an order for the steps.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for making a SnO thin film comprising:
providing a substrate and a tin oxide sputtering target, wherein the tin oxide sputtering target comprises uniformly mixed elemental Sn and $SnO_2$, and an atomic ratio of Sn atoms and O atoms in the tin oxide sputtering target satisfies 1:2<Sn:0<2:1;
spacing the substrate and the tin oxide sputtering target from each other;
sputtering the SnO thin film on the substrate by using a medium frequency magnetron sputtering method; and
annealing the SnO thin film in vacuum to obtain a polycrystalline SnO thin film;
wherein a background vacuum used in the annealing is in a range from about $10^{-3}$ Pa to about 10 Pa, an annealing temperature is in a range from about 150° C. to about 300° C., a speed of increasing a temperature of the SnO thin film to the annealing temperature in a range from about 1° C./min to about 20° C./min, the SnO thin film is annealed for about 1 hour to about 10 hours, a carrier mobility of the polycrystalline SnO thin film is in a range from about 0.5 $cm^2V^{-1}S^{-1}$ to about 2 $cm^2V^{-1}S^{-1}$, and a band gap of the polycrystalline SnO thin film is in a range from about 2.5 eV to 3.0 eV.

2. The method of claim 1, wherein an angle is formed between a tin oxide sputtering target surface and a substrate surface, the angle is ranged from about 20° to about 85°.

3. The method of claim 1, wherein a surface of the tin oxide sputtering target is parallel to a surface of the substrate, a distance between the tin oxide sputtering target and the substrate is smaller than or equal to 8 cm.

4. The method of claim 1, wherein the substrate is preheated at a temperature of about 50° C. to about 400° C. before the sputtering the SnO thin film on the substrate.

5. The method of claim 1, wherein the magnetron sputtering method is performed in a pure argon gas atmosphere.

6. The method of claim 1, wherein a current of the medium frequency magnetron sputter method is ranged from about 0.1 A to about 2.0 A, and the sputtering takes place for about 1 minute to about 120 minutes at a pressure of about 0.1 Pa to about 2.0 Pa.

7. The method of claim 6, wherein the current of the medium frequency magnetron sputter method is ranged from about 1.0 A to about 2.0 A.

8. The method of claim 1, wherein particle diameters of a Sn powder and a $SnO_2$ powder are less than or equal to 10 micrometers.

9. The method of claim 8, wherein a mass ratio of the Sn powder and the $SnO_2$ powder is in a range from 0.4 to 1.2.

10. The method of claim 1, wherein a transmittance of the polycrystalline SnO thin film is about 50% to about 80%.

* * * * *